US009036752B2

(12) United States Patent
Buck et al.

(10) Patent No.: US 9,036,752 B2
(45) Date of Patent: May 19, 2015

(54) LOW-DELAY FILTERING

(75) Inventors: Markus Buck, Biberach (DE); Tobias Wolff, Ulm (DE)

(73) Assignee: NUANCE COMMUNICATIONS, INC., Burlington, MA (US)

( * ) Notice: Subject to any disclaimer, the term of this patent is extended or adjusted under 35 U.S.C. 154(b) by 0 days.

(21) Appl. No.: 14/119,933

(22) PCT Filed: May 5, 2011

(86) PCT No.: PCT/US2011/035356
§ 371 (c)(1),
(2), (4) Date: Nov. 25, 2013

(87) PCT Pub. No.: WO2012/150942
PCT Pub. Date: Nov. 8, 2012

(65) Prior Publication Data
US 2014/0105338 A1 Apr. 17, 2014

(51) Int. Cl.
*H04B 1/00* (2006.01)
*H04B 1/10* (2006.01)
(Continued)

(52) U.S. Cl.
CPC .............. *H04B 1/10* (2013.01); *H03H 17/0213* (2013.01); *H03H 21/0027* (2013.01); *G10L 21/0232* (2013.01)

(58) Field of Classification Search
CPC .... H04B 1/10; H03H 21/0027; H03H 17/0213
USPC ......................................................... 375/350
See application file for complete search history.

(56) References Cited

U.S. PATENT DOCUMENTS

| 2002/0073128 A1* | 6/2002 | Egelmeers et al. | ............ 708/322 |
| 2004/0042557 A1* | 3/2004 | Kabel et al. | .................... 375/260 |

(Continued)

OTHER PUBLICATIONS

PCT International Search Report and Written Opinion of the ISA dated Feb. 8, 2012; for PCT Pat. App. No. PCT/US2011/035356; 12 pages.

(Continued)

*Primary Examiner* — Erin File
(74) *Attorney, Agent, or Firm* — Daly, Crowley, Mofford & Durkee, LLP

(57) ABSTRACT

A method of frequency-domain filtering is provided that includes a plurality of filters, the plurality of filters including at least one constrained filter(s) $\underline{W}=I$, I and at least one unconstrained filter(s) $\underline{W}=1,K-$ The method includes cascading the $\underline{W}_{k=i,K}$ unconstrained filter(s). A single constraint window C is applied to the cascaded $\underline{W}=i,K$ unconstrained filter(s). The $\underline{W}=1,I$ constrained filter(s) are cascaded with the constrained cascaded $W_{k}=1,K$ unconstrained filter(s) to form a resulting filter $\underline{W}_{ll}=C(\underline{W}\ 1\textcircled{x}\ \ldots\ \textcircled{x}\ \underline{W})\textcircled{x}\ \underline{W}\ \ldots\ \underline{W}$. The frequency domain representation of the single constraint window C may be based, at least in part, on a time domain representation of a single constraint window C that has been circularly shifted such that the frequency domain representation of the constraint window matches a property of the frequency domain representation of the cascaded $\underline{W}_{=1,K}$ unconstrained filters.

15 Claims, 5 Drawing Sheets

(51) Int. Cl.
   *H03H 17/02*   (2006.01)
   *H03H 21/00*   (2006.01)
   *G10L 21/0232* (2013.01)

(56) References Cited

U.S. PATENT DOCUMENTS

| | | |
|---|---|---|
| 2004/0260737 A1 | 12/2004 | Van Den Enden et al. |
| 2007/0290737 A1 | 12/2007 | Li |
| 2009/0072896 A1 | 3/2009 | Han |
| 2010/0153409 A1* | 6/2010 | Joshi et al. .................. 707/758 |
| 2010/0174767 A1 | 7/2010 | Villemoes |
| 2013/0332171 A1* | 12/2013 | Avendano et al. ............ 704/264 |

OTHER PUBLICATIONS

PCT International Perliminary Report on Patentability and Written Opinion of the ISA dated Nov. 14, 2013; for PCT Pat. App. No. PCT/US2011/035356; 9 pages.

* cited by examiner

LOW-DELAY FILTERING

TECHNICAL FIELD

The present invention relates to a system and method for low-delay filtering with low computational complexity, and more particularly to noise reduction in an In-car Communication System that includes efficient low-delay filtering.

BACKGROUND ART

In an In-Car Communication (ICC) system that supports speech communication between passengers, the signal recorded by the microphone(s) is processed and played back over one or more loudspeakers within the car. Communication can often be improved via noise reduction. Noise reduction typically involves a high processing delay. If the processing delay is too large, the signal may sound reverberant, similar to being in a bath room. Such a large delay is unsuitable for an ICC system.

Noise reduction is usually performed by filtering in the frequency-domain. With standard filterbank-based frequency domain methods, the low-delay requirements are typically not met because the filterbank introduces a relatively large delay. A common way to implement low-delay filtering is the so called overlap-save method. However, implementing time-invariant filtering using the overlap-save method is computationally expensive compared to commonly used filterbank methods. Methods have been proposed to reduce the complexity, however these methods are achieved at the cost of introducing slight signal distortions.

Basics of the Discrete Fourier Transformation (DFT)

The DFT and the inverse DFT can be performed with $\underline{X}=F\underline{x}$ and $\underline{x}=F^{-1}\underline{X}$ respectively. Here, x denotes the time-domain vector, X is the frequency-domain vector, and F denotes the DFT matrix with $$F|_{k,l} = \exp\left\{-j\frac{2\pi kl}{N}\right\}.$$

If N is power of 2 the DFT can be performed efficiently by a Fast Fourier Transform (FFT).

Multiplication in the Frequency Domain

It is known from Fourier theory that a convolution in time domain corresponds to a multiplication in frequency domain. In case of the DFT, this holds true only if one of the two signals is assumed to be a periodic signal with period length N where N is also the order of the DFT. This is called the cyclic convolution property of the DFT. In many practical applications, however, signals are not periodic. Hence, in general a multiplication in frequency domain does not lead to the same result as the time domain convolution. Therefore effects of cyclic convolution have to be avoided.

A large benefit of frequency domain processing is that a filtering operation can be realized simply by applying frequency dependent weights $W(\lambda)$ to a spectrum $X(\lambda)$ $$Y(\lambda)=W(\lambda)X(\lambda), \quad (1)$$

rather than performing convolutions in time domain. Here, $\lambda$ denotes the frequency index. Except for very low order filters, this reduces the processing load dramatically. To benefit from this efficient way of implementing a convolution, while obtaining the desired non-circular result, it must be ensured that the time-domain filter coefficients $w(n)=IFFT\{W(\lambda)\}$ exhibit $Q=N-P$ trailing zeros at the end $$\underline{w}=[w(0),\ldots,w(P-1),0,\ldots,0]^T$$

$$(2)$$

If this is the case, the time-domain result $\underline{y}=IFFT\{W(\lambda)X(\lambda)\}$ contains P−1 samples [y(0), . . . , y(P−2)] which correspond to a cyclic convolution. The remaining Q+1 samples [y(P−1), . . . , y(N−1)] correspond to a non-cyclic convolution.

Finally, the following should be noted. Consider a filter vector w(n) with P coefficients different from zero, and wherein there are $\tilde{P}$ non zero values at its end (these can be considered non-causal coefficients which reoccur at the end of the frame because of the cyclic property of the DFT.

$$\underline{w}=[w(0),\ldots,w(P-\tilde{P}-1),0,\ldots,0,w(N-\tilde{P}),\ldots,w(N-1)]^T \quad (3)$$

In this case, the output samples that are free from cyclic convolution effects are $$[y(P-\tilde{P}-1),\ldots,y(N-\tilde{P}-1)]. \quad (4)$$

Overlap-Save Filtering
Time-Invariant Filtering

In order to save computational power, signal filtering can be performed in the frequency domain. Instead of sample-based convolution, the filtering in the frequency domain can be performed by multiplication. The basic structure of the overlap-save method is depicted in FIG. 1 (prior art). The signal x(n) is segmented 101 into frames $\underline{x}(k)=[x(k R), \ldots, x(k R+N-1)]^T$ of length N and processed on a frame by frame basis in the frequency domain with time index n and frame index k. Each R samples a new frame is processed (i.e. adjacent frames overlap by N−R). The time-domain segments $\underline{x}(k)$ are transformed 103 into frequency-domain vectors $\underline{X}(k)=F\underline{x}(k)$. The filter vector w should have length N and shall exhibit Q zeros at the end as denoted in Eq. 2. It is transformed into the frequency domain by applying the DFT matrix F $$\underline{W}=F\underline{w}. \quad (5)$$

The result is then applied 105 to the signal vectors $$\underline{Y}(k)=\underline{W}\otimes\underline{X}(k) \quad (6)$$

where the symbol $\otimes$ stands for elementwise multiplication. As $\underline{w}$ obeys Eq. 2, the IFFT 107 of the filtered spectra $\underline{Y}(k)$, hence $\underline{y}(k)=F^{-1}\underline{Y}(k)$ has the property that its last Q+1 elements are valid in terms of corresponding to non-circular convolution. For obtaining the output signal stream $y_{out}(n)$ one block of R samples is extracted 109 from $\underline{y}(k)=[y(0, k), \ldots, y(N-1, k)]$ for each frame k, e.g. $y_{out}(k R+n)=y(N/2+n, k)$ for $0 \le n < R$. If $R \le Q+1$ the correct (non-cyclic) convolution can be realized. If the filter vector doesn't change over time the operation in Eq. 5 can be calculated only once before start of the processing rather than for each frame.

Time-Variant Filtering

There are also applications known where the filter is not fixed as described above. In J. J. Shynk: Frequency-domain and multirate adaptive filtering, IEEE Signal Processing Magazine, pp. 14-37, January 1992, which is hereby incorporated by reference herein, a frequency-domain adaptive filter method is described where the filter coefficients change due to updates in the frequency-domain $\underline{\tilde{W}}(k)=\underline{W}(k-1)+\underline{\Delta}(k)$. This is realized by a constraint in the time-domain:

$$\underline{W}(k)=F\text{diag}\{\underline{c}\}F^{-1}\underline{\tilde{W}}(k). \quad (7)$$

Multiplication with F and $F^{-1}$ represents the application of the FFT and the inverse FFT, respectively. In Shynk, a rectangular window $\underline{c}=\underline{c}_{hard}=[1,\ldots,1,0,\ldots,0]$ with P=N/2 ones and Q=N/2 zeros is used. Applying this window sets the filter coefficients selectively to zero (hard constraint). As this operation has to be performed for each modification of $\tilde{\underline{W}}$ (i.e., for each filter update) this procedure can be quite expensive. Even applying the constraint matrix $C_{hard}=F\mathrm{diag}\{\underline{c}_{hard}\}F^{-1}$ directly in the frequency domain to the unconstrained filter $\tilde{\underline{W}}(k)$ can be expensive.

In order to save computations, alternatively, this procedure can be approximated in the frequency domain, as proposed by G. Enzner, P. Vary: A soft-partitioned frequency-domain adaptive filter for acoustic echo cancellation, Int. Conf. on Acoustics, Speech, and Signal Processing (ICASSP), 2003, which is hereby incorporated by reference herein. Here, a soft constraint is applied instead of a hard constraint. As opposed to a rectangular time-domain window with hard rectangular edges that reflect a hard constraint and cause spurious effects/leakage, a time-domain window function that represents a soft constraint has smooth transitions/edges. Illustratively, and without limitation, a Hann window $w_H(n)$ may be used. Other soft windows may also be utilized, as known in the art, such as, without limitation, a Hamming window, a cosine window, a Gaussian window, a Bartlett-Hann window, a Blackman window, a Kaiser Window, and other parametric windows.

The Hann Window $w_H(n)$ may have length $P=N/2$ and be zero-padded by $Q=N/2$ zeros $$\underline{c}_{soft}=[w_H(0),\ldots,w_H(P-1),0,\ldots,0] \quad (8)$$

with $$w_H(n)=\tfrac{1}{2}(1-\cos(2\pi n/P)). \quad (9)$$

The corresponding frequency-domain constraint matrix $$C_{soft}=F\mathrm{diag}\{\underline{c}_{soft}\}F^{-1} \quad (10)$$

is a toeplitz matrix and exhibits neglectable values besides the main diagonal and some secondary diagonals. Setting these values to zero, the matrix-vector multiplication $\underline{W}=C_{soft}\tilde{\underline{W}}$ reduces to a short convolution in frequency domain $$W(\lambda,k)=\sum_{l=-L}^{L}C_{soft}(l)\tilde{W}(\lambda-l,k). \quad (11)$$

The coefficients $C_{soft}(l)$ are taken from the main and secondary diagonals of $C_{soft}$ $$C_{soft}(l)=C_{soft}|_{n,n+1},\text{ for }l\in[-L,\ldots,L]. \quad (12)$$

The coefficients for $L=3$ and for the example setting from paragraph [0015] are (note that the symbol * indicates conjugate complex):

$$C_{soft}(0)=0.25, \quad (13)$$

$$C_{soft}(1)=C^*_{soft}(-1)=0.21221j, \quad (14)$$

$$C_{soft}(2)=C^*_{soft}(-2)=0.125, \quad (15)$$

$$C_{soft}(3)=C^*_{soft}(-3)=0.042441j. \quad (16)$$

The constraint matrix $C_{soft,approx}$ that corresponds to the convolution in Eq. 11 is still a toeplitz matrix but sparse. FIG. 2 shows the exact time-domain constraint window $c_{soft}$, as well as the effective window after the approximation $c_{soft,approx}$.

Time-Variant Filtering for Spectral Weighting

For the purposes of noise reduction it is desirable to specify a filter response directly in the frequency domain, where for each frequency bin $\lambda$ a real-valued weighting factor is determined dynamically. Because of the real values, the time-domain representation of the filter is symmetric with respect to time index $n=0$ (considering a periodic extension of the buffer in both time directions). The filter weights may have been calculated with a certain filter characteristic which usually evaluates the signal-to-noise ratios of the different frequency bins. Examples for such filter characteristics can be found in G. Schmidt: Single-Channel Noise Suppression Based on Spectral Weighting—An Overview, Eurasip Newsletter, Vol. 15, No. 1, pp. 9-24, March 2004, which is hereby incorporated by reference it its entirety.

Illustratively, in a prior art in-car communication system, each frame k a vector of frequency-dependent filter weights $\tilde{\underline{W}}(k)$ was calculated by arbitrary filter characteristics. As the corresponding time domain filter is symmetric with respect to $n=0$ but the maximum of the time-domain constraint window from Eq. 8 is at $N/4$ and $C_{hard}$ from paragraph [0013] is also symmetric with respect to $N/4$, the filter coefficients were shifted in time by $N/4$ samples. This was performed in the frequency domain by applying a linear phase rotation $$\tilde{W}_D(\lambda,k)=\exp\{-j\pi\lambda/2\}\tilde{W}(\lambda,k)=(-j)^\lambda\tilde{W}(\lambda,k). \quad (17)$$

After that the approximated constraint matrix was applied $$\underline{W}(k)=C_{soft,approx}\tilde{\underline{W}}_D(k) \quad (18)$$

and the result in turn was applied to the input signal spectra $$\underline{Y}(k)=\underline{W}(k)\otimes\underline{X}(k). \quad (19)$$

The filtered time-domain signal buffer resulted as $\underline{y}(k)=F^{-1}\underline{Y}(k)$. R samples out of it have to be used as output signal $$Y_{out}(kR+n)=y(N/2+n,k),\text{ for }n\in[0,\ldots,R-1] \quad (20)$$

The filter weights in Eq. 17 were modified by phase rotation in order to match to the location of the constraint window, aligned to time index 0. This phase rotation undesirably adds complexity into the system.

SUMMARY OF THE EMBODIMENTS

In accordance with an embodiment of the invention, a method for adaptive digital filtering is provided. Illustratively, the method includes determining a time domain representation of a soft constraint window, the soft constraint window for zero padding an adaptive digital filter. The time domain representation of the soft constraint matrix is circularly shifted to align in the frequency domain with the adaptive digital filter. The time domain representation of the circularly shifted soft constraint matrix is transformed to a frequency domain representation of the circularly shifted soft constraint matrix. A frequency domain representation of the adaptive digital filter is determined The frequency domain representation of the circularly shifted soft constraint matrix window is applied to the frequency domain representation of the adaptive digital filter, such that the resulting adaptive digital filter corresponds to a digital filter in the time domain that includes a plurality of consecutive zeros.

In accordance with related embodiments of the invention, the resulting frequency domain representation of the digital filter is applied to a frequency domain representation of an input signal. An overlap-save methodology may be used. The corresponding time domain representation of the soft constraint window may be substantially a Hann window.

In accordance with another embodiment of the invention, a method of frequency-domain filtering is provided. The method includes cascading a plurality of filters $\underline{W}_{i=1,I}$ in the frequency domain, each of the filters $\underline{W}_i$ being constrained and having the same length, to form a combined filter $\underline{W}_{all}=\underline{W}_1\otimes\underline{W}_2\otimes\ldots\otimes\underline{W}_I$.

In accordance with related embodiments of the invention, $\underline{W}_{all}$ may be applied to a frequency domain representation of an input signal to form a frequency domain representation of an output signal. The frequency domain representation of the output signal may be transformed to a time domain representation of the output signal.

In accordance with another embodiment of the invention, a method of frequency-domain filtering is provided that includes a plurality of filters, the plurality of filters including at least one constrained filter(s) $\underline{W}_{i=1,I}$ and at least one unconstrained filter(s) $\underline{\tilde{W}}_{k=1,K}$. The method includes cascading the $\underline{\tilde{W}}_{k=1,K}$ unconstrained filter(s). A single constraint window C is applied to the cascaded $\underline{\tilde{W}}_{k-1,K}$ unconstrained filter(s). The $\underline{W}_{i-1,I}$ constrained filter(s) are cascaded with the constrained cascaded $\underline{\tilde{W}}_{k-1,K}$ unconstrained filter(s) to form a resulting filter $\underline{W}_{all}^* = C(\underline{\tilde{W}}_1 \otimes \ldots \otimes \underline{\tilde{W}}_K) \otimes \underline{W}_1 \ldots \underline{W}_I$.

In accordance with related embodiments of the invention, $\underline{W}_{all}$ may be applied to a frequency domain representation of an input signal to form a frequency domain representation of an output signal. The frequency domain representation of the output signal may be transformed to a time domain representation of the output signal. The $\underline{W}_{i=1,I}$ constrained filters may be a fixed equalizer $\underline{W}_{fixEQ}$ and the $\underline{\tilde{W}}_{k=1,k}$ unconstrained filters may be a dynamic equalizer $\underline{W}_{dynEQ}$, such that $\underline{W}_{all} = \underline{W}_{fixEQ} \otimes C \underline{\tilde{W}}_{dynEQ}$. $\underline{W}_{fixEQ}$ may be a hard constraint. $\underline{W}_{fixEQ}$ may be determined offline before the start of processing, with, for example, a rectangular window applied.

In accordance with another embodiment of the invention, a method of frequency-domain filtering is provided that includes a plurality of unconstrained filters $\underline{\tilde{W}}_{k-1,K}$. The method includes cascading the $\underline{\tilde{W}}_{k-1,K}$ unconstrained filters. A single constraint window C is applied to the cascaded $\underline{\tilde{W}}_{k=1,K}$ unconstrained filter(s) to form a resulting filter $\underline{W}_{all}^* = C(\underline{\tilde{W}}_1 \otimes \ldots \otimes \underline{\tilde{W}}_K)$.

In accordance with related embodiments of the invention, the $\underline{\tilde{W}}_{k=1,k}$ unconstrained filters may be a dynamic equalizer $\underline{\tilde{W}}_{dynEQ}$ and a noise reducer $\underline{\tilde{W}}_{NR}$, such that such $\underline{W}_{all} = C(\underline{\tilde{W}}_{dynEQ} \otimes \underline{\tilde{W}}_{NR})$. $\underline{W}_{all}$ may be applied to a frequency domain representation of an input signal to form a frequency domain representation of an output signal. The frequency domain representation of the output signal may be transformed to a time domain representation of the output signal.

In accordance with another embodiment of the invention, a method of beamforming and noise reduction is provided. The method includes applying a spectral filtering $\underline{W}_{RF,m}$ to a plurality of microphone inputs $\underline{X}_m(k)$, $0 \leq m < M$ in the frequency domain to form a beamformed input signal $$X_{BF}(k) = \sum_{m=0}^{M-1} \underline{W}_{BF,m} \otimes X_m(k);$$

$\underline{\tilde{W}}_{k=1,K}$ unconstrained noise reduction filter(s) are cascaded. A single constraint window C is applied to the cascaded $\underline{\tilde{W}}_{k=1,K}$ unconstrained filter(s) to form $\underline{W}_{all} = C(\underline{W}_1 \otimes \ldots \otimes \underline{\tilde{W}}_K)$; $\underline{W}_{all}$ is applied to the beamformed input signal to form a frequency domain representation of an output signal $\underline{Y}(k) = \underline{W}_{all} \otimes \underline{X}_{BF}(k)$.

In accordance with related embodiments of the invention, the $\underline{\tilde{W}}_{k=1,K}$ unconstrained filters may be a dynamic noise reducer $\underline{\tilde{W}}_{NR}$, such that $\underline{W}_{all}^* = C \underline{\tilde{W}}_{NR}$. Applying $\underline{W}_{all}$ to the beamformed input signal may form a frequency domain representation of an output signal $\underline{Y}(k) = (C\underline{\tilde{W}}_{NR}(k)) \otimes \underline{X}_{BF}(k)$. The frequency domain representation of the output signal $\underline{Y}(k)$ may be transformed to a time domain representation of the output signal.

In accordance with another embodiment of the invention, a system for adaptive digital filtering is provided. The system includes means for determining a frequency domain representation of a digital filter. The system further includes means for applying a frequency domain representation of a soft constraint window to the frequency domain representation of the digital filter, such that the resulting frequency domain representation of the digital filter corresponds to a digital filter in the time domain that includes a plurality of consecutive zeros. The frequency domain representation of the soft constraint window is based, at least in part, on a time domain representation of a soft constraint window that has been circularly shifted such that the frequency domain representation of the constraint window matches a property of the frequency domain representation of the digital filter.

In accordance with related embodiments of the invention, the system may include means for applying the resulting frequency domain representation of the digital filter to a frequency domain representation of an input signal. The system may include means for performing an overlap-save method. The time domain representation of the soft constraint window may be substantially a Hann window.

In accordance with another embodiment of the invention, a system for frequency-domain filtering is provided. The system includes means for cascading a plurality of filters $\underline{W}_{i=1,I}$ in the frequency domain, each of the filters $\underline{W}_i$ being constrained and having the same length, to form a combined filter $\underline{W}_{all} = \underline{W}_1 \otimes \underline{W}_2 \otimes \ldots \otimes \underline{W}_I$.

In accordance with related embodiments of the invention, the system may further include means for applying $\underline{W}_{all}$ to a frequency domain representation of an input signal to form a frequency domain representation of an output signal. The system may further include means for transforming the frequency domain representation of the output signal to a time domain representation of the output signal.

In accordance with another embodiment of the invention, a system for frequency-domain filtering is provided. The system includes a plurality of filters, the plurality of filters including at least one constrained filter(s) $\underline{W}_{i=1,I}$ and at least one unconstrained filter(s) $\underline{\tilde{W}}_{k-1,K}$. The system further includes means for cascading the $\underline{\tilde{W}}_{k-1,K}$ unconstrained filter(s). The system further includes means for applying a single constraint window C to the cascaded $\underline{\tilde{W}}_{k-1,K}$ unconstrained filter(s), and means for cascading the $\underline{W}_{i-1,I}$ constrained filter(s) with the constrained cascaded $\underline{\tilde{W}}_{k=1,K}$ unconstrained filter(s) to form a resulting filter $\underline{W}_{all}^* = C(\underline{\tilde{W}}_1 \otimes \ldots \otimes \underline{\tilde{W}}_K) \otimes \underline{W}_1 \ldots \underline{W}_I$.

In accordance with related embodiments of the invention, the system may further include means for applying $\underline{W}_{all}$ to a frequency domain representation of an input signal to form a frequency domain representation of an output signal. The system may further include means for transforming the frequency domain representation of the output signal to a time domain representation of the output signal. The $\underline{W}_{i-1,I}$ constrained filters may be a fixed equalizer $\underline{W}_{fixEQ}$ and the $\underline{\tilde{W}}_{k=1,k}$ unconstrained filters may be a dynamic equalizer $\underline{\tilde{W}}_{dynEQ}$, such that $\underline{W}_{all} = \underline{\tilde{W}}_{fixEQ} \otimes C \underline{\tilde{W}}_{dynEQ}$.

In accordance with another embodiment of the invention, a system for frequency-domain filtering is provided that includes a plurality of unconstrained filters $\underline{\tilde{W}}_{k-1,K}$, the system. The system further includes means for cascading the $\underline{\tilde{W}}_{k=1,K}$ unconstrained filters, and means for applying a single constraint window $C_{casc}$ to the cascaded $\tilde{\underline{W}}_{k=1,K}$ unconstrained filter(s) to form a resulting filter $\underline{W}_{all}^* = C(\tilde{\underline{W}}_1 \otimes \ldots \otimes \tilde{\underline{W}}_K)$.

In accordance with related embodiments of the invention, the $\tilde{W}_{k=1,k}$ unconstrained filters may be a dynamic equalizer $\tilde{\underline{W}}_{dynEQ}$ and a noise reducer $\tilde{\underline{W}}_{NR}$ such that such $\underline{W}_{all} = C(\tilde{\underline{W}}_{dynEQ} \otimes \tilde{\underline{W}}_{NR})$. The system may further include means for applying $\underline{W}_{all}$ to a frequency domain representation of an input signal to form a frequency domain representation of an output signal. The system may further include means for transforming the frequency domain representation of the output signal to a time domain representation of the output signal.

In accordance with another embodiment of the invention, a system for beamforming and noise reduction is provided. The system includes means for applying a spectral filtering $\underline{W}_{BF,m}$ to a plurality of microphone inputs $\underline{X}_m(k)$, $0 \leq m < M$ in the frequency domain to form a beamformed input signal $$\underline{X}_{BF}(k) = \sum_{m=0}^{M-1} \underline{W}_{BF,m} \otimes \underline{X}_m(k).$$

The system further includes means for cascading $\tilde{\underline{W}}_{k=1,K}$ unconstrained noise reduction filter(s), and means for applying a single constraint window C to the cascaded $\tilde{\underline{W}}_{k=1,K}$ unconstrained filter(s) to form $\underline{W}_{all} = C_{casc}(\tilde{\underline{W}}_1 \otimes \ldots \otimes \tilde{\underline{W}}_K)$. The system further includes means for applying $\underline{W}_{all}$ to the beamformed input signal to form a frequency domain representation of an output signal $\underline{Y}(k) = \underline{W}_{all} \otimes \underline{X}_{BF}(k)$.

In accordance with related embodiments of the invention, the $\tilde{W}_{k=1,K}$ unconstrained filters may be a dynamic noise reducer $\tilde{\underline{W}}_{NR}$, such that $\underline{W}_{all}^* = C\tilde{\underline{W}}_{NR}$. Applying $\underline{W}_{all}$ to the beamformed input signal may form a frequency domain representation of an output signal $\underline{Y}(k) = (C\tilde{\underline{W}}_{NR}(k)) \otimes \underline{X}_{BF}(k)$. The system may further include means for transforming the frequency domain representation of the output signal $\underline{Y}(k)$ to a time domain representation of the output signal.

In accordance with another embodiment of the invention, a computer program product for use on a computer system for adaptive digital filtering is provided. The computer program product includes at least one non-transitory computer readable medium having computer executable program code thereon. The computer executable program code includes program code for defining a frequency domain representation of a digital filter. Further the product includes program code for applying a frequency domain representation of a soft constraint window to the frequency domain representation of the digital filter, such that the resulting frequency domain representation of the digital filter corresponds to a digital filter in the time domain that includes a plurality of consecutive zeros. The frequency domain representation of the soft constraint window is based, at least in part, on a time domain representation of a soft constraint window that has been circularly shifted such that the frequency domain representation of the constraint window matches a property of the frequency domain representation of the digital filter.

In accordance with related embodiments of the invention, the computer program product may include program code for applying the resulting frequency domain representation of the digital filter to a frequency domain representation of an input signal. The computer program product may include program code for performing an overlap-save method. The time domain representation of the soft constraint window may be substantially a Hann window.

In accordance with another embodiment of the invention, a computer program product for use on a computer system for frequency-domain filtering is provided. The computer program product comprising includes at least one non-transitory computer readable medium having computer executable program code thereon. The computer executable program code includes program code for cascading a plurality of filters $\underline{W}_{i=1,I}$ in the frequency domain, each of the filters $\underline{W}_i$ being constrained and having the same length, to form a combined filter $\underline{W}_{all} = \underline{W}_1 \otimes \underline{W}_2 \otimes \ldots \otimes \underline{W}_I$.

In accordance with related embodiments of the invention, the computer program product may include program code for applying $\underline{W}_{all}$ to a frequency domain representation of an input signal to form a frequency domain representation of an output signal. The computer program product may include program code for transforming the frequency domain representation of the output signal to a time domain representation of the output signal.

In accordance with another embodiment of the invention, a computer program product for use on a computer system for frequency-domain filtering is provided. The computer program product includes at least one non-transitory computer readable medium having computer executable program code thereon. The computer executable program code includes program code for cascading the $\tilde{\underline{W}}_{k=1,K}$ unconstrained filter(s), and program code for applying a single constraint window C to the cascaded $\tilde{\underline{W}}_{k=1,K}$ unconstrained filter(s). The computer executable program code further includes program code program code for cascading the $\underline{W}_{i=1,I}$ constrained filter(s) with the constrained cascaded $\tilde{\underline{W}}_{k=1,K}$ unconstrained filter(s) to form a resulting filter $\underline{W}_{all}^* = C(\tilde{\underline{W}}_1 \otimes \ldots \otimes \tilde{\underline{W}}_K) \otimes \underline{W}_1 \ldots \underline{W}_I$.

In accordance with related embodiments of the invention, the computer program product may further include program code for applying $\underline{W}_{all}$ to a frequency domain representation of an input signal to form a frequency domain representation of an output signal. the computer program product may further include program code for transforming the frequency domain representation of the output signal to a time domain representation of the output signal. The $\underline{W}_{1=1,J}$ constrained filters may be a fixed equalizer $\underline{W}_{fixEQ}$ and the $\tilde{\underline{W}}_{k=1,k}$ unconstrained filters may be a dynamic equalizer $\tilde{\underline{W}}_{dynEQ}$, such that $\underline{W}_{all} = \underline{W}_{fixEQ} \otimes C \tilde{\underline{W}}_{dynEQ}$.

In accordance with another embodiment of the invention, a computer program product for use on a computer system for frequency-domain filtering is provided. The computer program product includes at least one non-transitory computer readable medium having computer executable program code thereon. The computer executable program code includes program code for cascading $\tilde{\underline{W}}_{k=1,K}$ unconstrained filters. The computer executable program code further includes program code for applying a single constraint window $C_{casc}$ to the cascaded $\tilde{\underline{W}}_{k-1,K}$ unconstrained filter(s) to form a resulting filter $\underline{W}_{all}^* = C(\tilde{\underline{W}}_1 \otimes \ldots \otimes \tilde{\underline{W}}_K)$.

In accordance with related embodiments of the invention, the $\tilde{W}_{k-1,k}$ unconstrained filters may be a dynamic equalizer $\tilde{\underline{W}}_{dynEQ}$ and a noise reducer $\tilde{\underline{W}}_{NR}$ such that such $\underline{W}_{all} = C(\tilde{\underline{W}}_{dynEQ} \otimes \tilde{\underline{W}}_{NR})$. The computer executable program code may further include program code for applying $\underline{W}_{all}$ to a frequency domain representation of an input signal to form a frequency domain representation of an output signal. The computer executable program code may further include program code for transforming the frequency domain representation of the output signal to a time domain representation of the output signal.

In accordance with another embodiment of the invention, a computer program product for use on a computer system for beamforming and noise reduction is provided. The computer program product includes at least one non-transitory computer readable medium having computer executable program code thereon. The computer executable program code includes program code for applying a spectral filtering $\underline{W}_{BF,m}$ to a plurality of microphone inputs $\underline{X}_m(k)$, $0 \leq m < M$ in the frequency domain to form a beamformed input signal $$\underline{X}_{BF}(k) = \sum_{m=0}^{M-1} \underline{W}_{BF,m} \otimes \underline{X}_m(k).$$

The computer executable program code further includes program code for cascading $\underline{\tilde{W}}_{k=1,K}$ unconstrained noise reduction filter(s), and applying a single constraint window C to the cascaded $\underline{\tilde{W}}_{k=1,K}$ unconstrained filter(s) to form $\underline{W}_{all} = C_{casc}(\underline{\tilde{W}}_1 \otimes \ldots \otimes \underline{\tilde{W}}_K)$. The computer executable program code further includes program code for program code for applying $\underline{W}_{all}$ to the beamformed input signal to form a frequency domain representation of an output signal $\underline{Y}(k) = \underline{W}_{all} \otimes \underline{X}_{BF}(k)$.

In accordance with related embodiments of the invention, the $\underline{\tilde{W}}_{k=1,K}$ unconstrained filters is a dynamic noise reducer $\underline{\tilde{W}}_{NR}$, such that $\underline{W}_{all}^* = C \underline{\tilde{W}}_{NR}$. Applying $\underline{W}_{all}$ to the beamformed input signal may form a frequency domain representation of an output signal $\underline{Y}(k) = (C\underline{\tilde{W}}_{NR}(k)) \otimes \underline{X}_{BF}(k)$. The program code may further include code for transforming the frequency domain representation of the output signal Y(k) to a time domain representation of the output signal.

In accordance with further related embodiments to the above-described embodiments of the invention, the frequency domain representation of the single constraint window C may be based, at least in part, on a time domain representation of a single constraint window C that has been circularly shifted such that the frequency domain representation of the constraint window matches a property of the frequency domain representation of the cascaded $\underline{\tilde{W}}_{k=1,k}$ unconstrained filters. The time domain representation of the single constraint window may be a soft constraint window, for example, substantially a Hann window.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

In illustrative embodiments of the invention, an efficient low-delay method and system for dynamic filtering in the frequency domain is provided. Various embodiments include a modification to the "overlap-save" technique known from adaptive filtering to match dynamic noise reduction requirements. Furthermore, this technique has been extended to a frequency domain framework that supports multiple filter operations within one processing frame. Thus, for example, an equalizing and noise reduction can be applied without additional delay. In addition the framework has been extended to multi-channel operation with beamforming and adaptive mixing to support multiple speakers. Thereby, the delay and the computational effort are kept at a minimum. Details are discussed below.

Embodiments of the invention may be applied to, without limitation, an In-Car Communication (ICC) system that supports communication between passengers inside the car by using built-in microphones and loudspeakers to reinforce the speech signal. Signal processing like beamforming, noise reduction, or equalizing may be applied for improving the quality of the ICC output signal. Thereby, a low processing delay is crucial in order to avoid an unnatural reverberant sound. Other applications of the system and method include, for example, live mixing scenarios over teleconferencing systems, and communication/speech/audio systems within other types of vehicles and environments. Other embodiments may be applicable to a wide variety of other digital signal processing environments including, without limitation, sonar and radar signal processing, sensor array processing, spectral estimation, statistical signal processing, digital image processing, control of systems, biomedical signal processing, and seismic data processing.

Efficient Constraint for Real-Valued Frequency-Domain Filters

As described above, the filter weights in Eq. 17 were conventionally modified by phase rotation in order to match to the location of the constraint window. Instead, in accordance with various embodiments of the invention, the constraint window is modified to match to the properties of the filter. Illustratively, as the original time-domain filter weights are symmetric with respect to n=0 the time-domain constraint window may be left-shifted by N/4 samples by a cyclic shift. Thus, the phase rotation in Eq. 2.17 can be avoided and the filter weights remain real valued. Furthermore, the constraint window is symmetric with respect to n=0 which corresponds to a real valued frequency-domain constraint matrix C. This has no effect on delay, but, reduces the computational complexity since the matrix-vector product $C\underline{\tilde{W}}(k)$ has only real-valued multiplications rather than complex-valued ones.

Figure 1:
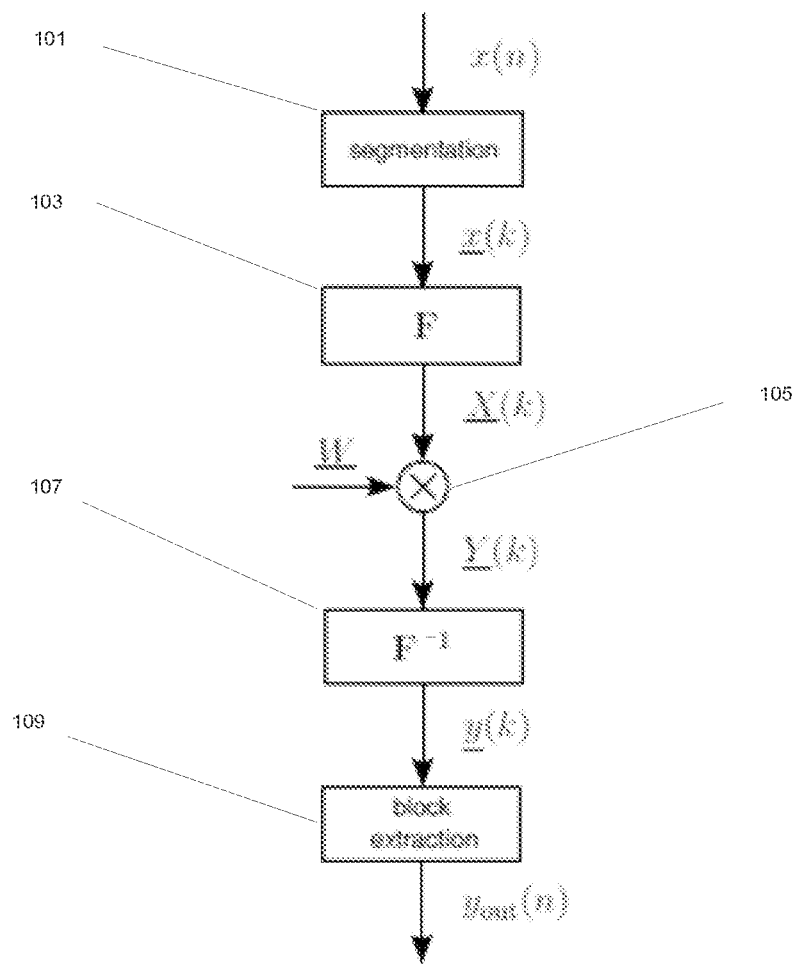
FIG. 1 is a block diagram showing an overlap-save methodology (prior art)
Figure 2:
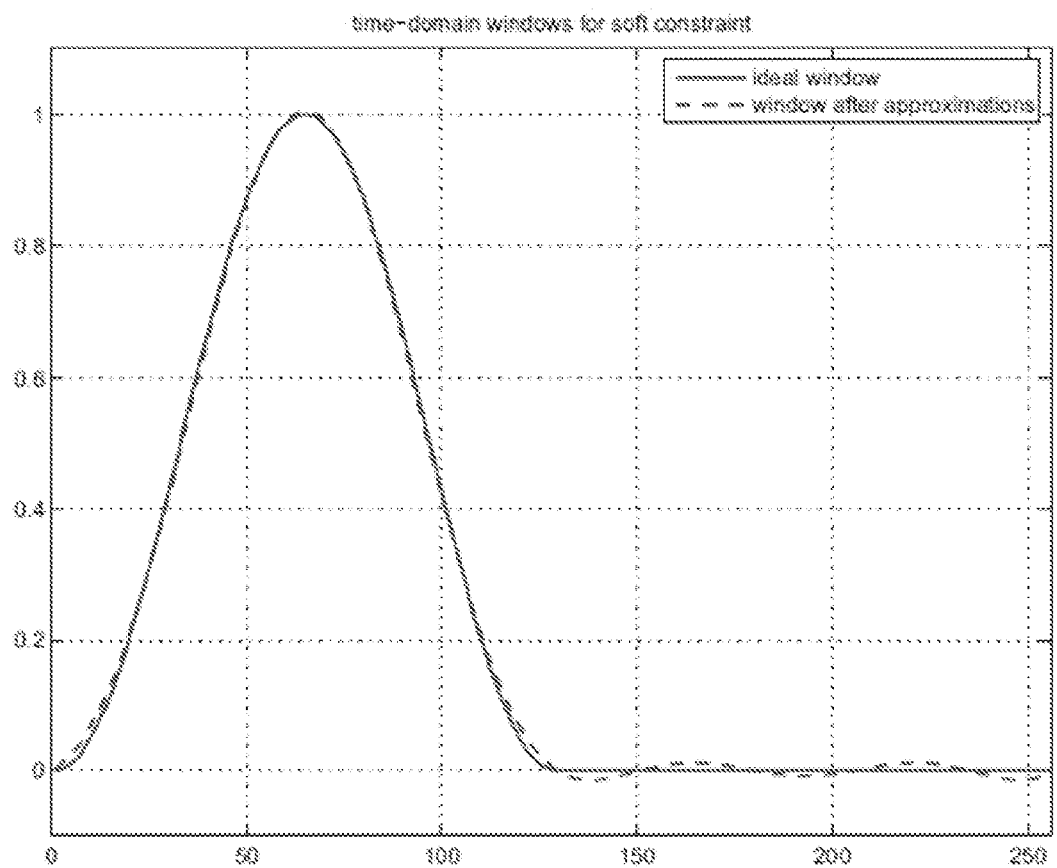
FIG. 2 shows an exact time-domain constraint window $c_{soft}$, as well as the effective window after the approximation $C_{soft,approx}$ (prior art)
Figure 3:
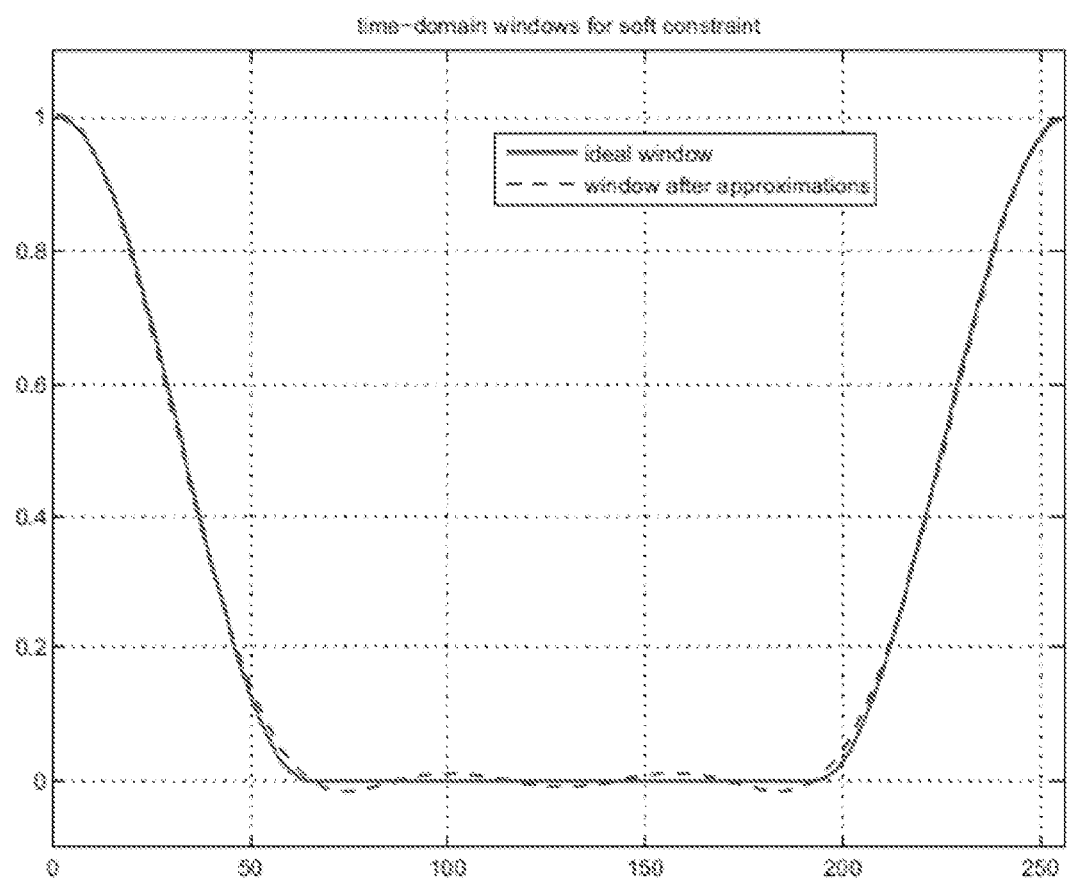
FIG. 3 shows an illustrative ideal time-domain constraint window, as well as the effective window after approximation and when shifted, in accordance with an embodiment of the invention.

FIG. 3 shows the ideal time-domain constraint window, as well as the effective window after the approximation when shifted by N/4 samples, in accordance with an embodiment of the invention. The approximation has again been done, without limitation, with L=3 resulting in the coefficients $$C_{soft}(0) = 0.25, \tag{21}$$

$$C_{soft}(1) = C_{soft}(-1) = 0.21221, \tag{22}$$

$$C_{soft}(2) = C_{soft}(-2) = 0.125, \tag{23}$$

$$C_{soft}(3) = C_{soft}(-3) = 0.042441. \tag{24}$$

The output signal is then $$y_{out}(kR+n)=y(N/4+n,k), \text{ for } n \in [0,\ldots,R-1]. \quad (25)$$

Concept of Multi-Stage Frequency-Domain Filtering

Multiple filters $\underline{W}_i$ may be cascaded in frequency domain if they exhibit the same length N. Their time-domain representation can exhibit different numbers of zeros $Q_i$, valid filter coefficients $P_i$ and acausal coefficients $\tilde{P}_i$. For the combined filter $$\underline{W}_{all}=\underline{W}_1 \otimes \underline{W}_2 \otimes \ldots \otimes \underline{W}_I \quad (26)$$

the length of valid coefficients results is $$P_{all}=(\Sigma_{i=1}^I P_i)-I+1 \quad (27)$$

and the number of zeros results is $$Q_{all}=N-P_{all}. \quad (28)$$

The number of non-causal coefficients accumulate to $$\tilde{P}=\sum_{i=1}^I \tilde{P}_i. \quad (29)$$

For the filtered signal in time domain $$\underline{y}(k)=F^{-1}(\underline{W}_{all} \otimes \underline{X}(k)) \quad (30)$$

the samples $y(P_{all}-\tilde{P}_{all}-1,k),\ldots,y(N-\tilde{P}_{all}-1,k)$ correspond to non-circular convolution (the indices $P_{all}-\tilde{P}_{all}-1,\ldots,N-\tilde{P}_{all}-1$ may exceed the range $[0,\ldots,N-1]$ in this case the output buffer y(k) has to be extended periodically. As long as $Q_{all}+1 \geq R$, there is no need to go back in the time domain as it would be done in a straight forward approach.

Cascading Unconstrained Filters in the Frequency Domain

In Eq. 26 constrained filters are cascaded, i.e., the time-domain vectors $\underline{w}_i$ exhibit $Q_i$ trailing zeros. For some applications one or more of these filters may be calculated as spectral weights regardless of any constraint. For example, for unconstrained noise reduction or dynamic equalization the weighting factors may be dynamically calculated separately for each band. In such cases, a constraint $C_j$ may be applied to each unconstrained filter $\underline{\tilde{W}}_j$, as is described above, which has the advantage that the order of each filter can be controlled through the respective constraint. This, however, may not be computationally efficient.

Consider the general case of a cascade of I constrained filters $\underline{W}_i$ and K unconstrained weight vectors $\underline{\tilde{W}}_k$. The overall frequency-domain filter is $$\underline{W}_{all}=C_1\underline{\tilde{W}}_1 \otimes \ldots \otimes C_K \underline{\tilde{W}}_K \otimes \underline{W}_1 \ldots \underline{W}_I. \quad (31)$$

Here, each unconstrained filter vector is constrained prior to cascading. In illustrative embodiments of the invention, alternatively, one single constraint matrix $C_{casc}$ may be applied to the cascade of unconstrained filter vectors $$\underline{W}_{all}=C_{casc}(\underline{\tilde{W}}_1 \otimes \ldots \otimes \underline{\tilde{W}}_K) \otimes \underline{W}_1 \ldots \underline{W}_I. \quad (32)$$

$C_{casc}$ is characterized by $P_{casc}$ time-domain filter coefficients, with $\tilde{P}_{casc}$ acausal ones, and $Q_{casc}$ zeros. However, instead of assigning a specific filter length $P_k$ to each stage $\underline{\tilde{W}}_k$, the accumulated filter $\underline{\tilde{W}}_1 \otimes \ldots \otimes \underline{\tilde{W}}_K$ is treated entirely. This method may be advantageous for real-time applications where $\underline{\tilde{W}}_k$ are determined dynamically and the constrained filters $\underline{W}_i$ are fixed filters which have been designed prior to processing.

EXAMPLES

For the examples below, the following parameters, without limitation, may be applied:
Sample rate: $f_s$=16000 Hz
FFT order: N=256
Frameshift: R=N/4
Number of microphones: M=2

Example 1

Fixed and Dynamic Equalization

Figure 4:
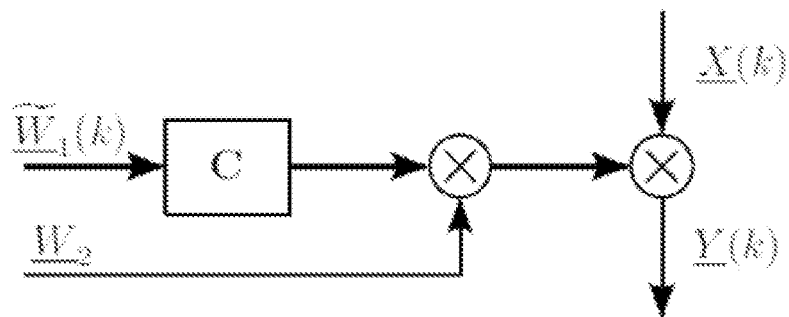
FIG. 4 is a schematic of a system that includes at least one of a fixed, constrained filter $\underline{W}_{i=1,J}$ and at least one of an unconstrained $\underline{\tilde{W}}_{k=1,K}$, in accordance with an embodiment of the invention.

FIG. 4 is a schematic of a system that includes at least one of a fixed, constrained filter $\underline{W}_{i=1,I}$ and at least one of an unconstrained $\underline{\tilde{W}}_{k=1,K}$, in accordance with an embodiment of the invention. If there are a plurality of constrained filters, they may be cascaded to form a single filter $\underline{W}_2$. Similarly, if there is a plurality of unconstrained filters, they may be cascaded to form $\underline{\tilde{W}}_1$. A single constraint window C, which may be a soft constraint window, is applied to $\underline{\tilde{W}}_1$. As described previously, the frequency domain representation of the single constraint window C may be based, at least in part, on a time domain representation of a single soft constraint window C (for example, a Hann Window) that has been circularly shifted such that the frequency domain representation of the constraint window matches a property (e.g. alignment) of the frequency domain representation of the cascaded $\underline{\tilde{W}}_{k-1,K}$ unconstrained filters.

The $\underline{W}_1$ cascaded, constrained filter may then be cascaded with the constrained cascaded $\underline{\tilde{W}}_I$ unconstrained filter to form a resulting filter $\underline{W}_{all}^*=C(\underline{\tilde{W}}_1 \otimes \ldots \otimes \underline{\tilde{W}}_K) \otimes \underline{W}_1 \ldots \underline{W}_I$. $\underline{W}_{all}$ may be applied to a frequency domain representation of an input signal $\underline{X}(k)$ to form a frequency domain representation of an output signal $\underline{Y}(k)$. The frequency domain representation of the output signal $Y(k)$ may then be transferred back into a time domain representation of the output signal.

More particularly, a fixed and a dynamic equalizer may be realized jointly within the above-proposed framework, in accordance with various embodiments of the invention. Illustratively, the fixed part $\underline{W}_{fixEQ}$ corresponds to a precalculated causal filter of length R with $P_{fixed}$=R and $\tilde{P}_{fixed}$=0. The dynamic part $\underline{\tilde{W}}_{dynEQ}$ relates to real-valued weights in the frequency domain. Thus, the dynamic part corresponds to a symmetric time-domain filter. Before applying the dynamic filter in the frequency-domain it is ensured by a constraint matrix $C_{Ex1}$ that 2R−1 time-domain coefficients are (approximately) zero (Eq. 3 with $P_{dyn}$=2R+1 and $\tilde{P}_{dyn}$=R). Thus, the overall resulting filter has $\tilde{P}_{overall}$=R acausal coefficients and $P_{overall}-\tilde{P}_{overall}$=2R causal coefficients $$\underline{W}_{Ex1}=\underline{W}_{fixEQ} \otimes C_{Ex1} \underline{\tilde{W}}_{dynEQ}. \quad (33)$$

The valid output signal can be retrieved from $\underline{y}(k)=F^{-1}(W_{Ex1} \otimes \underline{X}(k))$ as $[y(2R,k),\ldots,y(3R-1,k)]$. This segment has length $N-P_{overall}$=R. Thus, the output signal stream results as $$y_{out}(kR+n)=y(2R+n,k). \quad (34)$$

Example 2

Dynamic Equalization and Noise Reduction

Figure 5:
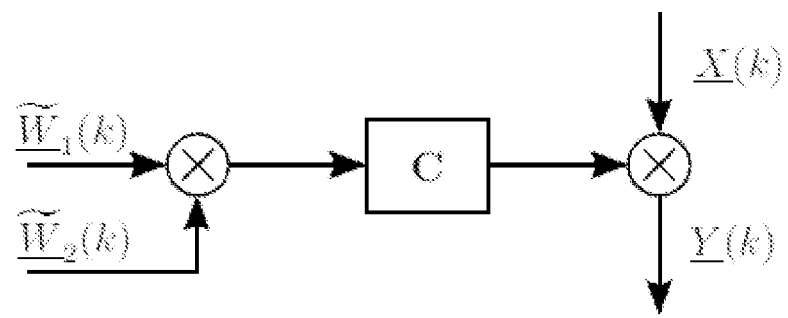
FIG. 5 shows a schematic of a frequency-domain filtering system that includes a plurality of unconstrained filters $\underline{\tilde{W}}_{k=1,K}$, in accordance with an embodiment of the invention.

FIG. 5 shows a schematic of a frequency-domain filtering system that includes a plurality of unconstrained filters $\underline{\tilde{W}}_{k=1,K}$, in accordance with an embodiment of the invention.

The $\tilde{\underline{W}}_{k=1,K}$ unconstrained filters are cascaded. As described previously, a single constraint window C, which ma be a soft constraint window) is applied to the cascaded $\tilde{\underline{W}}_{k=1,K}$ unconstrained filter(s) to form a resulting filter $\underline{W}_{all}{}^{*}=C(\tilde{\underline{W}}_1 \otimes \ldots \otimes \tilde{\underline{W}}_K)$. The frequency domain representation of the single constraint window C may be based, at least in part, on a time domain representation of a single soft constraint window C (for example, a Hann Window) that has been circularly shifted such that the frequency domain representation of the constraint window matches a property (e.g. alignment) of the frequency domain representation of the cascaded $\tilde{\underline{W}}_{k=1,k}$ unconstrained filters. $\underline{W}_{all}$ may be applied to a frequency domain representation of an input signal $\underline{X}(k)$ to form a frequency domain representation of an output signal Y(k), which then may be transformed to a time domain representation of the output signal.

Illustratively, a dynamic equalization and a noise reduction can be combined, in accordance with an embodiment of the invention. The unconstrained filters $\tilde{\underline{W}}_{dynEQ}$ and $\tilde{\underline{W}}_{NR}$ both are real-valued. They are multiplied before applying a constraint $$\underline{W}_{Ex2}=C_{Ex2}(\tilde{\underline{W}}_{dynEQ} \otimes \tilde{\underline{W}}_{NR}) \tag{35}$$

In this case there is $P_{Ex2}=2R-1$ and $\tilde{P}_{Ex2}=R-1$. Thus $C_{Ex2}=C_{soft,approx}$ can be applied.

Example 3

Beamformer and Noise Reduction

Figure 6:
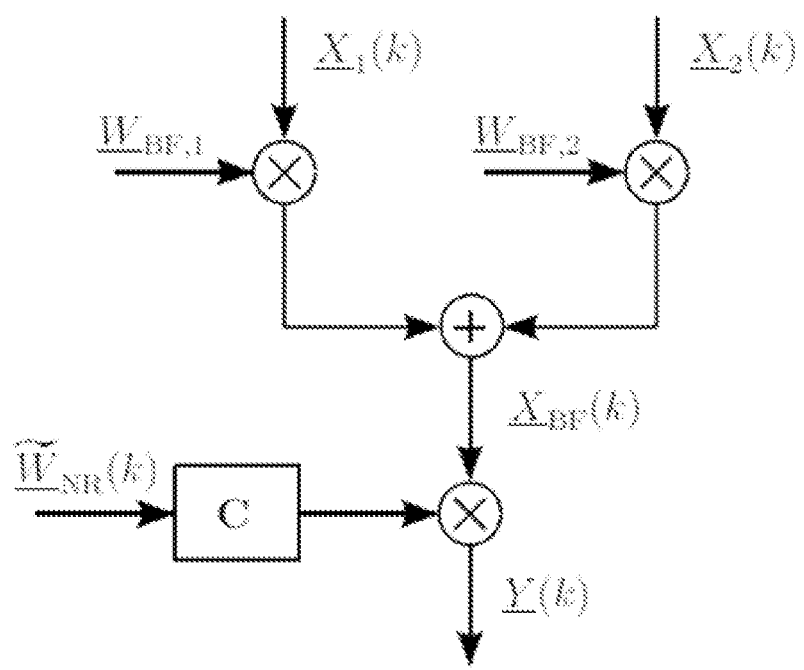
FIG. 6 shows a schematic of a combination of a beamformer and a noise reduction within a low-delay filtering framework, in accordance with an embodiment of the invention.

A further embodiment of the invention is the combination of a beamformer and a noise reduction within the low-delay filtering framework, as shown in FIG. 6, in accordance with an embodiment of the invention. The input signal vectors $\underline{X}_m(k)$, $0 \leq m < M$ for the M inputs are processed to one output signal $\underline{Y}(k)$.

First a predetermined, spectral filtering $\underline{W}_{BF,m}$ may be applied within the beamformer individually to each microphone input channel m in order to realize a time delay compensation. These filters have been designed as causal fractional delay filters of length P=R+2 in the time domain. They have been transformed by FFT into the complex-valued frequency domain filters. Applying them to a signal means that only N−R−1 samples could be used if the filtered signals were transformed back into time-domain. However, the filtered signals are kept in the frequency domain and added:

$$X_{BF}(k) = \sum_{m=0}^{M-1} \underline{W}_{BF,m} \otimes \underline{X}_m(k). \tag{36}$$

In terms of cyclic convolution effects the sum has no effect. After that, dynamic spectral weighting may be applied.

Within the noise reduction for each frequency bin a real-valued weighting factor $\tilde{\underline{W}}_{NR}(k)$ is determined dynamically. After introducing the constraint $C_{Ex3}=C_{soft,approx}$ with $P_{Ex3}=2R-1$ and $\tilde{P}_{Ex3}=R-1$ the filter can be applied $$\underline{Y}(k)=(C_{Ex3}\tilde{\underline{W}}_{NR}(k)) \otimes \underline{X}_{BF}(k). \tag{37}$$

The present invention described in the above embodiments may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof.

Computer program logic implementing all or part of the functionality previously described herein may be embodied in various forms, including, but in no way limited to, a source code form, a computer executable form, and various intermediate forms (e.g., forms generated by an assembler, compiler, linker, or locator.) Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies, networking technologies, and internetworking technologies. The computer program may be distributed in any form as a removable storage medium with accompanying printed or electronic documentation (e.g., shrink wrapped software or a magnetic tape), preloaded with a computer system (e.g., on system ROM or fixed disk), or distributed from a server or electronic bulletin board over the communication system (e.g., the Internet or World Wide Web.)

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL.)

Although various exemplary embodiments of the invention have been disclosed, it should be apparent to those skilled in the art that various changes and modifications can be made which will achieve some of the advantages of the invention without departing from the true scope of the invention.

What is claimed is:

1. A method of adaptive digital filtering, the method comprising:
   determining a time domain representation of a soft constraint window, the soft constraint window for zero padding an adaptive digital filter;
   circularly shifting the time domain representation of the soft constraint matrix to align in the frequency domain with the adaptive digital filter;

transforming the time domain representation of the circularly shifted soft constraint matrix to a frequency domain representation of the circularly shifted soft constraint matrix;
determining a frequency domain representation of the adaptive digital filter;
applying the frequency domain representation of the circularly shifted soft constraint matrix window to the frequency domain representation of the adaptive digital filter, such that the resulting adaptive digital filter corresponds to a digital filter in the time domain that includes a plurality of consecutive zeros.

2. The method according to claim 1, further comprising:
applying the resulting frequency domain representation of the digital filter to a frequency domain representation of an input signal.

3. The method according to claim 2, further comprising using an overlap-save method.

4. The method according to claim 1, wherein the corresponding time domain representation of the soft constraint window is substantially a Hann window.

5. The method according to claim 1, further including:
cascading a plurality of filters $\underline{W}_{i=1,I}$ in the frequency domain, each of the filters $\underline{W}_i$ being constrained and having the same length, to form a combined filter $\underline{W}_{all} = \underline{W}_1 \otimes \underline{W}_2 \otimes \ldots \otimes \underline{W}_I$.

6. The method according to claim 5, further comprising applying $\underline{W}_{all}$ to a frequency domain representation of an input signal to form a frequency domain representation of an output signal.

7. The method according to claim 6, further comprising transforming the frequency domain representation of the output signal to a time domain representation of the output signal.

8. The method according to claim 1, wherein the frequency domain filtering further includes a plurality of filters, the plurality of filters including at least one constrained filter(s) $\underline{W}_{i=1,I}$ and at least one unconstrained filter(s) $\underline{\tilde{W}}_{k=1,K}$, the method comprising:
cascading the $\underline{\tilde{W}}_{k=1,K}$ unconstrained filter(s);
applying a single constraint window C to the cascaded $\underline{\tilde{W}}_{k=1,K}$ unconstrained filter(s); and
cascading the $\underline{W}_{i=1,I}$ constrained filter(s) with the constrained cascaded $\underline{\tilde{W}}_{k=1,K}$ unconstrained filter(s) to form a resulting filter $\underline{W}_{all}{}^* = C(\underline{\tilde{W}}_1 \otimes \ldots \otimes \underline{\tilde{W}}_K) \otimes \underline{W}_1 \ldots \underline{W}_I$.

9. The method according to claim 8, further comprising applying $\underline{W}_{all}$ to a frequency domain representation of an input signal to form a frequency domain representation of an output signal.

10. The method according to claim 9, further comprising transforming the frequency domain representation of the output signal to a time domain representation of the output signal.

11. The method according to claim 8, wherein the $\underline{W}_{i=1,I}$ constrained filters is a fixed equalizer $\underline{W}_{fixEQ}$ and the $\underline{\tilde{W}}_{k=1,k}$ unconstrained filters is a dynamic equalizer $\underline{\tilde{W}}_{dynEQ}$, such that $\underline{W}_{all} = \underline{W}_{fixEQ} \otimes C\underline{\tilde{W}}_{dynEQ}$.

12. The method according to claim 8, wherein the frequency domain representation of the constraint window matches a property of the frequency domain representation of the cascaded $\underline{\tilde{W}}_{k=1,k}$ unconstrained filters.

13. A computer program product for use on a computer system for frequency-domain filtering, the computer program product comprising at least one non-transitory computer readable medium having computer executable program code thereon, the computer executable program code comprising:
program code for cascading $\underline{\tilde{W}}_{k=1,K}$ unconstrained filter(s);
program code for applying a single constraint window C to the cascaded $\underline{\tilde{W}}_{k=1,K}$ unconstrained filter(s);
program code for cascading $\underline{W}_{=i=1,I}$ constrained filter(s) with the constrained cascaded $\underline{\tilde{W}}_{k=1,K}$ unconstrained filter(s) to form a resulting filter $\underline{W}_{all}{}^* = C(\underline{\tilde{W}}_1 \otimes \ldots \otimes \underline{\tilde{W}}_K) \otimes \underline{W}_1 \ldots \underline{W}_I$.

14. The computer program product according to claim 13, further comprising program code for applying $\underline{W}_{all}$ to a frequency domain representation of an input signal to form a frequency domain representation of an output signal.

15. The computer product according to claim 13, wherein the $\underline{W}_{i=1,I}$ constrained filters is a fixed equalizer $\underline{W}_{fixEQ}$ and the $\underline{\tilde{W}}_{k=1,K}$ unconstrained filters is a dynamic equalizer $\underline{\tilde{W}}_{dynEQ}$, such that $\underline{W}_{all} = \underline{W}_{fixEQ} \otimes C\underline{\tilde{W}}_{dynEQ}$.

* * * * *